(12) United States Patent
Moriyama et al.

(10) Patent No.: US 8,222,734 B2
(45) Date of Patent: Jul. 17, 2012

(54) HYBRID INTEGRATED CIRCUIT DEVICE AND ELECTRONIC DEVICE

(75) Inventors: Shinji Moriyama, Komoro (JP); Tomio Yamada, Komoro (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/306,347

(22) Filed: Nov. 29, 2011

(65) Prior Publication Data

US 2012/0106110 A1  May 3, 2012

Related U.S. Application Data

(63) Continuation of application No. 13/020,767, filed on Feb. 3, 2011, now Pat. No. 8,084,852, which is a continuation of application No. 12/769,207, filed on Apr. 28, 2010, now Pat. No. 7,902,656, which is a continuation of application No. 12/401,237, filed on Mar. 10, 2009, now Pat. No. 7,755,182, which is a continuation of application No. 11/819,334, filed on Jun. 27, 2007, now Pat. No. 7,518,228, which is a continuation of application No. 11/302,144, filed on Dec. 14, 2005, now Pat. No. 7,323,770, which is a continuation of application No. 10/470,549, filed as application No. PCT/JP02/00534 on Jan. 25, 2002, now abandoned.

(30) Foreign Application Priority Data

Feb. 6, 2001 (JP) .................................. 2001-029982

(51) Int. Cl.
*H01L 23/24* (2006.01)
*H01L 23/04* (2006.01)
*H01L 23/053* (2006.01)
*H01L 23/12* (2006.01)
*H01L 23/48* (2006.01)
*H01L 23/52* (2006.01)
*H01L 29/40* (2006.01)
*H01L 23/28* (2006.01)

(52) U.S. Cl. ........ 257/724; 257/698; 257/700; 257/774; 257/787; 257/E21.597

(58) Field of Classification Search .................. 257/698, 257/700, 724, 774, 787, E21.597
See application file for complete search history.

(56) References Cited

U.S. PATENT DOCUMENTS 4,878,846 A * 11/1989 Schroeder ........................ 439/65
(Continued)

FOREIGN PATENT DOCUMENTS

JP            6-291216        10/1994
(Continued)

*Primary Examiner* — Ida M Soward
(74) *Attorney, Agent, or Firm* — Mattingly & Malur, PC

(57) ABSTRACT

A hybrid integrated circuit device having high mount reliability includes a module substrate which is a ceramic wiring substrate, a plurality of electronic component parts laid out on the main surface of the module substrate, a plurality of electrode terminals laid out on the rear surface of the module substrate, and a cap which is fixed to the module substrate to cover the main surface of the module substrate. The electrode terminals include ones which are aligned along the edges of the module substrate and power voltage supply terminals which are located inner than these electrode terminals. The electrode terminals aligned along the substrate edges are coated, at least in their portions close to the substrate edge, with a protection film having a thickness of several tens micrometers or less. Connection reinforcing terminals consist of a plurality of divided terminals which are independent of each other, and are ground terminals.

3 Claims, 13 Drawing Sheets

U.S. PATENT DOCUMENTS

| | | | |
|---|---|---|---|
| 5,067,007 A * | 11/1991 | Otsuka et al. | 257/701 |
| RE34,291 E * | 6/1993 | Liguori et al. | 361/784 |
| 5,239,448 A * | 8/1993 | Perkins et al. | 361/764 |
| 5,280,193 A * | 1/1994 | Lin et al. | 257/723 |
| 5,285,352 A * | 2/1994 | Pastore et al. | 361/707 |
| 5,467,252 A * | 11/1995 | Nomi et al. | 361/760 |
| 5,519,176 A | 5/1996 | Goodman et al. | 174/255 |
| 5,639,989 A | 6/1997 | Higgins, III | 174/386 |
| 5,668,406 A * | 9/1997 | Egawa | 257/690 |
| 5,672,911 A | 9/1997 | Patil et al. | 257/691 |
| 5,767,447 A | 6/1998 | Dudderar et al. | 174/546 |
| 5,796,165 A | 8/1998 | Yoshikawa et al. | 257/728 |
| 5,798,571 A | 8/1998 | Nakajima | 257/784 |
| 5,832,598 A | 11/1998 | Greenman et al. | 29/840 |
| 5,847,936 A | 12/1998 | Forehand et al. | 361/794 |
| 5,870,289 A | 2/1999 | Tokuda et al. | 361/779 |
| 5,949,654 A * | 9/1999 | Fukuoka | 361/760 |
| 5,962,917 A | 10/1999 | Moriyama | 257/697 |
| 6,052,287 A | 4/2000 | Palmer et al. | 361/767 |
| 6,132,543 A | 10/2000 | Mohri et al. | 156/89.12 |
| 6,188,127 B1 | 2/2001 | Senba et al. | 257/686 |
| 6,225,702 B1 | 5/2001 | Nakamura | 257/702 |
| 6,229,100 B1 | 5/2001 | Fjelstad | 174/261 |
| 6,278,264 B1 | 8/2001 | Burstein et al. | 323/282 |
| 6,310,303 B1 | 10/2001 | Luvara et al. | 174/261 |
| 6,330,165 B1 | 12/2001 | Kohjiro et al. | 361/760 |
| 6,353,540 B1 * | 3/2002 | Akiba et al. | 361/794 |
| 6,362,964 B1 | 3/2002 | Dubhashi et al. | 361/707 |
| 6,403,881 B1 * | 6/2002 | Hughes | 174/559 |
| 6,429,454 B2 | 8/2002 | Hatada et al. | 257/786 |
| 6,433,411 B1 | 8/2002 | Degani et al. | 257/678 |
| 6,435,883 B1 | 8/2002 | Warren | 439/71 |
| 6,492,719 B2 | 12/2002 | Miyamoto et al. | 257/686 |
| 6,538,898 B1 | 3/2003 | Prindivill et al. | 361/760 |
| 6,630,727 B1 * | 10/2003 | Tutsch et al. | 257/668 |
| 6,710,441 B2 | 3/2004 | Eden et al. | 257/698 |
| 6,734,550 B2 | 5/2004 | Martin et al. | 257/704 |
| 6,777,819 B2 | 8/2004 | Huang | 257/796 |
| 6,778,406 B2 | 8/2004 | Eldridge et al. | 257/776 |
| 7,239,014 B2 | 7/2007 | Ogawa et al. | 257/700 |
| 7,323,770 B2 | 1/2008 | Moriyama et al. | 257/691 |
| 2003/0156400 A1 | 8/2003 | Dibene et al. | 361/803 |
| 2004/0056367 A1 | 3/2004 | Jassowski | 257/782 |
| 2005/0250254 A1 | 11/2005 | Ishizu et al. | 438/125 |

FOREIGN PATENT DOCUMENTS

| | | |
|---|---|---|
| JP | 8-148597 | 6/1996 |
| JP | 9-018145 | 1/1997 |
| JP | 09-22692 | 1/1997 |
| JP | 9-69584 | 3/1997 |
| JP | 9-116091 | 5/1997 |
| JP | 9-153286 | 6/1997 |
| JP | 10-275875 | 10/1998 |
| JP | 10-308464 | 11/1998 |
| JP | 11-224915 | 8/1999 |
| JP | 2000-323645 | 11/2000 |
| JP | 2000-349225 | 12/2000 |
| KR | 1996-32697 | 9/1996 |
| KR | 2000-11461 | 2/2000 |

\* cited by examiner

HYBRID INTEGRATED CIRCUIT DEVICE AND ELECTRONIC DEVICE

This application is a continuation of U.S. patent application Ser. No. 13/020,767, filed Feb. 3, 2011, which is a continuation of U.S. patent application Ser. No. 12/769,207, filed Apr. 28, 2010, now U.S. Pat. No. 7,902,656, which is a continuation of U.S. patent application Ser. No. 12/401,237, filed Mar. 10, 2009, now U.S. Pat. No. 7,755,182, which is a continuation of U.S. patent application Ser. No. 11/819,334, filed Jun. 27, 2007, now U.S. Pat. No. 7,518,228, which is a continuation of U.S. patent application Ser. No. 11/302,144, filed Dec. 14, 2005, now U.S. Pat. No. 7,323,770, which is a continuation of U.S. patent application Ser. No. 10/470,549, filed Jul. 30, 2003, now abandoned, which was a U.S. national stage application of PCT/JP02/00534, filed Jan. 25, 2002, the contents of which are hereby incorporated by reference into this application.

TECHNICAL FIELD

The present invention relates to a hybrid integrated circuit device and an electronic device which incorporates the hybrid integrated circuit device, and particularly to a technique which is applied effectively to a high-frequency power amplifier module, which is used for the transmitter of a wireless communication unit such as a cellular telephone unit, and to a wireless communication unit (portable telephone unit) which incorporates the high-frequency power amplifier module.

BACKGROUND ART

One known hybrid integrated circuit device is a high-frequency power amplifier module which is used for the wireless communication section of mobile communication units such as automobile telephone units and portable telephone units.

Japanese Patent Unexamined Publications No. Hei 8(1996)-148597 and No. Hei 9(1997)-18145 describe hybrid integrated circuit devices.

The patent publication No. Hei 8(1996)-148597 describes semiconductor modules of LGA (Land Grid Array) type.

The patent publication No. Hei 9(1997)-18145 describes a technique for preventing cracks from occurring in a ceramic multi-layer substrate, from its positions at the rim of electrode terminals into the inside of substrate, based on the fabrication process, prior to the annealing process, of forming the electrode terminals on the surface of a laminated green sheet, and thereafter laminating a patterned greed sheet (a greed sheet with the formation, at its positions confronting the electrode terminals, of through-holes having a diameter smaller than the electrode terminals) on the laminated green sheet while leaving small areas of electrode terminals.

The high-frequency power amplifier module used for the portable telephone unit is amid the technical progress in terms of size reduction and performance upgrading. A high-frequency power amplifier module is mounted on a setup board (circuit board) by soldering the electrode terminals (connection terminals), which are located at the bottom edge of module, to the lands on the surface of setup board. Specifically, the high-frequency power amplifier module is placed by being positioned on the setup board, and solder which has been already applied to the lands of setup board is heated (to reflow) so that the module terminals are soldered to the lands and fixed on the setup board.

In recent years, there is a growing trend of the LGA structure adopted for the high-frequency power amplifier module to meet the demands of size reduction, performance upgrading, increasing pins, and mount area reduction.

The inventors of the present invention have confirmed the following programs in regard to the LGA structure of the high-frequency power amplifier module designed for the portable telephone unit.

FIG. 24 is a schematic diagram explaining the faulty setup of a high-frequency power amplifier module revealed by the study conducted by the inventors prior to the present invention. A high-frequency power amplifier module has its substrate 1 made of a multi-layer ceramic wiring substrate, and electrode terminals 2 are formed on the rear surface to align along the edge of substrate.

The high-frequency power amplifier module is mounted (fixed) on a setup board 3 by overlapping the electrode terminals 2 on the lands (foot print) 4 formed on the upper surface of the board 3, and fusing (to reflow) solder 5 which has been already applied to the lands 4 and the surface of electrode terminals 2 so that the electrode terminals 2 are fixed by soldering to the lands 4. Although the figure shows only one electrode terminal 2, all electrode terminals formed along the edges around the bottom of the module substrate 1 are connected to the lands to complete the mounting of module.

However, it was found that this high-frequency power amplifier module develops cracks 6 in the module substrate 1 as shown in FIG. 24, resulting in a degraded reliability of the high-frequency power amplifier module.

The electrode terminals 2 and solder 5 are both metallic and therefore have a greater bonding strength than the bonding strength between the ceramic module substrate 1 and the electrode terminals 2. In addition, the ceramic module substrate 1 has a thermal expansivity coefficient of around $7 \times 10^{-6}/$, while the setup board 3 is a glass-epoxy board (made of glass fiber and epoxy resin) having a thermal expansivity coefficient of around $16 \times 10^{-6}/$, exhibiting a significant difference.

In consequence, due to the stress caused by the difference of thermal expansion and contraction between the setup board 3 and electrode terminals 2, the relatively fragile module substrate 1 is liable to develop a crack 6. The crack 6 starts at a position (point) subjected to a large stress and advances deep into the module substrate 1 as shown in FIG. 24. The dashed-line arrows in the figure indicate the direction of stress which causes the crack. The development of crack 6 can deteriorate the reliability of high-frequency power amplifier module.

The above-mentioned patent publication No. Hei 9(1997)-18145 describes, as mentioned above, a technique for preventing cracks from occurring in a ceramic multi-layer substrate, from its positions at the rim of electrode terminals into the inside of substrate, based on the fabrication process, prior to the annealing process, of forming the electrode terminals on the surface of a laminated green sheet, and thereafter laminating a patterned greed sheet (a greed sheet with the formation, at its positions nearby the electrode terminals, of through-holes having a diameter smaller than the electrode terminals) on the laminated green sheet while leaving small areas of electrode terminals, however, it does not describe in detail the mechanism of crack development.

The inventors of the present invention have found a fact that cracks are liable to occur in the module substrate at its positions of the electrode terminals, at their positions close to the substrate edge, which are located close to the edges of both ends or sides of the module substrate. Namely, the development of cracks, which are liable at positions of the electrode terminals 2, in their portions close to the substrate edge, which are located close to the edges of the module substrate 1, can be alleviated by coating these portions at least with a protection film.

In regard to the above-mentioned conventional technique, i.e., overlapping of a green sheet, with through-holes which are smaller in diameter than the electrode terminals being formed, at positions confronting the electrode terminals, and subsequent annealing, it is necessary for the sake preventing the damage in the edge section to make wide edge section where the through-holes are narrowest, resulting in a larger green sheet and thus an increased size of high-frequency power amplifier module.

Moreover, the green sheet with through-holes overlapped on another green sheet necessitates marginal dimensions so as to ensure the covering of the rim of electrode terminals, results in a much larger green sheet.

Therefore, the conventional technique based on the overlapping of green sheet causes an increased dimensions of green sheet, which precludes the reduction in the size of module board and thus the size of high-frequency power amplifier module.

A green sheet having through-holes needs to be thicker to some extent for the sake of damage-free treatment, and the use of extra green sheet material results in an increased cost of the module.

It is an object of the present invention to provide a hybrid integrated circuit device having high mounting reliability, and an electronic device which incorporates this hybrid integrated circuit device.

Another object of the present invention is to provide a hybrid integrated circuit device having high mounting reliability and having potential of manufacturing cost reduction, and an electronic device which incorporates this hybrid integrated circuit device.

Still another object of the present invention is to provide a high-frequency power amplifier module having high mounting reliability, and a wireless communication unit which incorporates this high-frequency power amplifier module.

Still another object of the present invention is to provide a high-frequency power amplifier module having high mounting reliability and having potential of manufacturing cost reduction, and a wireless communication unit which incorporates this high-frequency power amplifier module.

These and other objects and novel features of the present invention will become apparent from the following description and attached drawings.

DISCLOSURE OF THE INVENTION

Among the affairs of the present invention disclosed in this specification, representatives are briefed as follows.

(1) The inventive hybrid integrated circuit device is structured as follows. It comprises a module substrate which is a rectangular ceramic wiring substrate, a plurality of electronic component parts laid out on the main surface of the module substrate, a plurality of electrode terminals laid out on the rear surface of the module substrate, and a metallic cap which is fixed to the module substrate to cover the main surface of the module substrate. The electrode terminals include a plurality of electrode terminals which are aligned along the edges of module substrate and power voltage supply terminals which are located inner than these electrode terminals. The electrode terminals aligned along the module substrate edges are coated, at least in their portions close to the substrate edge, with a protection film. A plurality of semiconductor amplifying elements are connected tandem on the module substrate to form a high-frequency power amplifier module. The protection film, which is a glass layer or solder resist layer, is formed by printing to have a thickness of several tens micrometers or less.

The metallic cap is fixed to the module substrate by means of resilient hooks which are part of the cap and hook stoppers which are provided on the module substrate. Four sets of hook and hook stopper are provided at the four corners of the cap and module substrate.

The module substrate has its four corners cut away inwardly, in which portions are disposed the hook stoppers made of conductor which latch with the hooks of the cap. The cap retains the rectangular profile. Further provided at the four corners of the module substrate are ground terminals, which are connected electrically to the conductive hook stoppers. The hooks extend downward to reach or nearly reach the rear surface of the module substrate.

The connection reinforcing terminals consist of a plurality of divided terminals which are independent of each other. For example, a plurality of power voltage supply terminals are aligned along one side of the module substrate and also along the direction orthogonal to this side.

(2) The hybrid integrated circuit device is fabricated based on the following method. The hybrid integrated circuit device comprises a module substrate of a ceramic wiring substrate, a plurality of electronic component parts laid out on the main surface of the module substrate, a plurality of electrode terminals laid out on the rear surface of the module substrate, and a cap which is fixed to the module substrate to cover the main surface of the module substrate. The method includes a step of overlapping a plurality of green sheets, with wiring patterns being formed thereon, and pressing the sheets to make a laminated green sheet having an electrode terminal section on the rear surface, a step of printing paste to form a protective overlay so that terminals located close to the edges of laminated green sheet are coated, at least in their portions close to the edge of laminated green sheet, with the protective overlay, and a step of annealing the laminated green sheet, electrode terminal section and protection film to complete a module substrate having electrode terminals which are partially coated with a protection film.

(3) The inventive electronic device is structured as follows. It comprises a setup board having lands for fixing a hybrid integrated circuit device on the main surface, and a high-frequency power amplifier module having its electrode terminals connected electrically by soldering to the lands. The hybrid integrated circuit device comprises a module substrate which is a rectangular ceramic wiring substrate, a plurality of electronic component parts laid out on the main surface of the module substrate, a plurality of electrode terminals laid out on the rear surface of the module substrate, and a rectangular metallic cap which is fixed to the module substrate to cover the main surface of the module substrate. Ground terminals are provided at the four corners of the module substrate. The metallic cap is fixed to the module substrate by means of resilient hooks which are part of the cap and hook stoppers which are provided on the module substrate. The hooks are fixed by soldering to the lands formed on the main surface of the setup board. The module substrate has its four corners cut away inwardly, in which portion are provided the hook stoppers. The cap has a rectangular profile. The electrode terminals include a plurality of electrode terminals which are aligned along the edges of module substrate and a plurality of power voltage supply terminals which are located inner than these electrode terminals. The power voltage supply terminals are fixed by soldering to the lands formed on the main surface of the setup board. The electrode terminals aligned along the edges of module board are coated, at least in their portions close to the board edge, with a protection film having a thickness of several tens micrometers or less. The hybrid integrated circuit device is a high-frequency power amplifier module, which constitutes a wireless communication unit.

The high-frequency power amplifier module (hybrid integrated circuit device) arranged as described in the above item (1) attains the following effectiveness.

(a) In the high-frequency power amplifier module (hybrid integrated circuit device), the electrode terminals of LGA structure aligned along the edges of module substrate are coated in their portions close to the substrate edge with a protection film, and accordingly even if there arises a thermal stress between the electrode terminals and the module substrate when the module is mounted on the setup board of portable telephone unit, the module substrate is prevented from cracking in its terminal border portion close to the substrate edge, and thus the package interior is free from penetration of water or the like through cracks, whereby the high-frequency power amplifier module and portable telephone unit are enhanced in reliability and life span.

(b) The protection film which is made from printed paste can be as thin as several tens micrometers or less, enabling the reduction of thickness of the module substrate and also the reduction of manufacturing cost owing to the reduced consumption of paste. In consequence, the reduction of manufacturing cost of the portable telephone unit can be attained.

(c) The protection film which is made from printed paste is thinner than a green sheet having through-holes, allowing the size reduction of the module substrate and thus the size reduction of the high-frequency power amplifier module. In consequence, the size reduction of the portable telephone unit can be attained.

(d) The high-frequency power amplifier module is fixed to the setup board by additional use of the power voltage supply terminals besides the electrode terminals, whereby the high-frequency power amplifier module is enhanced in mount rigidity. The power voltage supply terminals also serve as ground terminals, stabilizing the ground voltage in every circuit section of the high-frequency power amplifier module, whereby the stable operation can be expected. In consequence, the portable telephone unit operates stably, enabling the user to have comfortable communication.

(e) The power voltage supply terminals are aligned along the long side and short side of the module substrate. On this account, the high-frequency power amplifier module is mounted by being placed uprightly on multiple reflowing molten solder spots so that the module substrate is mounted by being spaced out evenly from the setup board, whereby power supply properties such as efficiency can be stabilized. In consequence, the portable telephone unit operates stably, enabling the user to have comfortable communication.

(f) The module substrate has the formation cut-away portions at both ends of long sides, in which portions the cap has its hooks latching with the hook stoppers of the module substrate, thereby building a package, and hook support arms have their solder fillet jutting out as little as 0.3 m. Accordingly, the mount area can be virtually within the area defined by the profile of cap, enabling the reduction of mount area. In consequence, the size reduction of the portable telephone unit can be attained.

(g) The hook support arms extend downward to reach or nearly reach the rear surface of the module substrate, and accordingly the high-frequency power amplifier module, when mounted on the setup board by soldering, is connected electrically by solder to the grounding lands, whereby the high-frequency power amplifier module is enhanced in mount rigidity and ensured in electrical grounding. In consequence, the portable telephone unit operates stably, enabling the user to have comfortable communication.

(h) The provision of ground terminals at the four corners of the rectangular module substrate facilitates the layout design of external terminals including the signal terminals and power terminals of the high-frequency power amplifier module, and it also facilitates the layout of wiring lines on the setup board which mounts the module.

BEST MODE FOR CARRYING OUT THE INVENTION

The embodiments of this invention will be explained in detail with reference to the drawings. Throughout the figures, items having the same functions are referred to by the common symbols, and explanation thereof is not repeated.

Embodiment 1

FIG. 1 through FIG. 17 are diagrams pertaining to a high-frequency power amplifier module and a portable telephone unit which incorporates the module based on an embodiment (embodiment 1) of this invention. Among the figures, FIG. 1 through FIG. 11 are of the high-frequency power amplifier module, and FIG. 12 through FIG. 17 are of the portable telephone unit.

Explained in this embodiment are a high-frequency power amplifier module, as hybrid integrated circuit device, having amplifying systems for GSM (Global System for Mobile Communication) and DCS (Digital Cellular System), and a wireless communication unit which incorporates the high-frequency power amplifier module.

Figure 1:
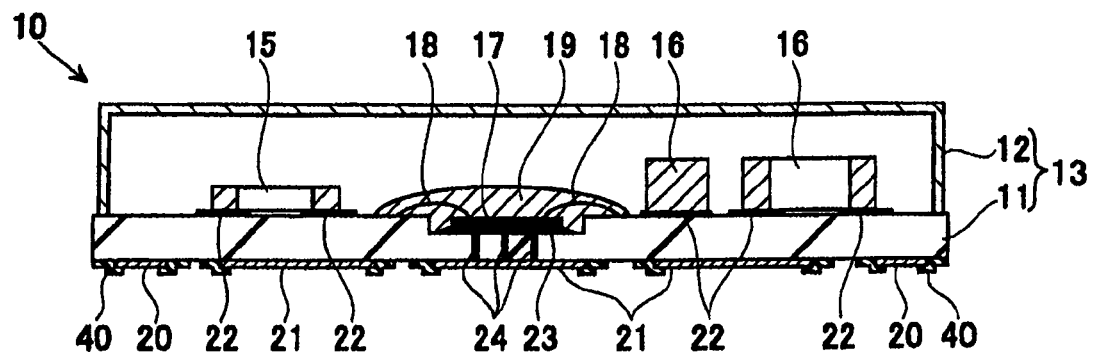
FIG. 1 is a schematic cross-sectional diagram of a high-frequency power amplifier module based on an embodiment (embodiment 1) of this invention.
Figure 2:
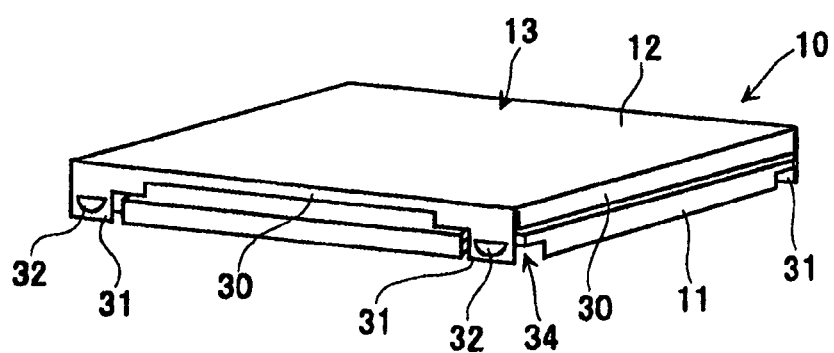
FIG. 2 is a perspective view of the high-frequency power amplifier module of the embodiment 1.

The high-frequency power amplifier module 10 has an external appearance of a flat cuboid as shown in FIG. 1 and FIG. 2.

The high-frequency power amplifier module 10 is structured to have a module substrate 11 which is a ceramic wiring substrate and a cap 12 which is put on one surface (main surface) of the module substrate 11, thereby building a flat cuboidal package 13.

Figure 3:
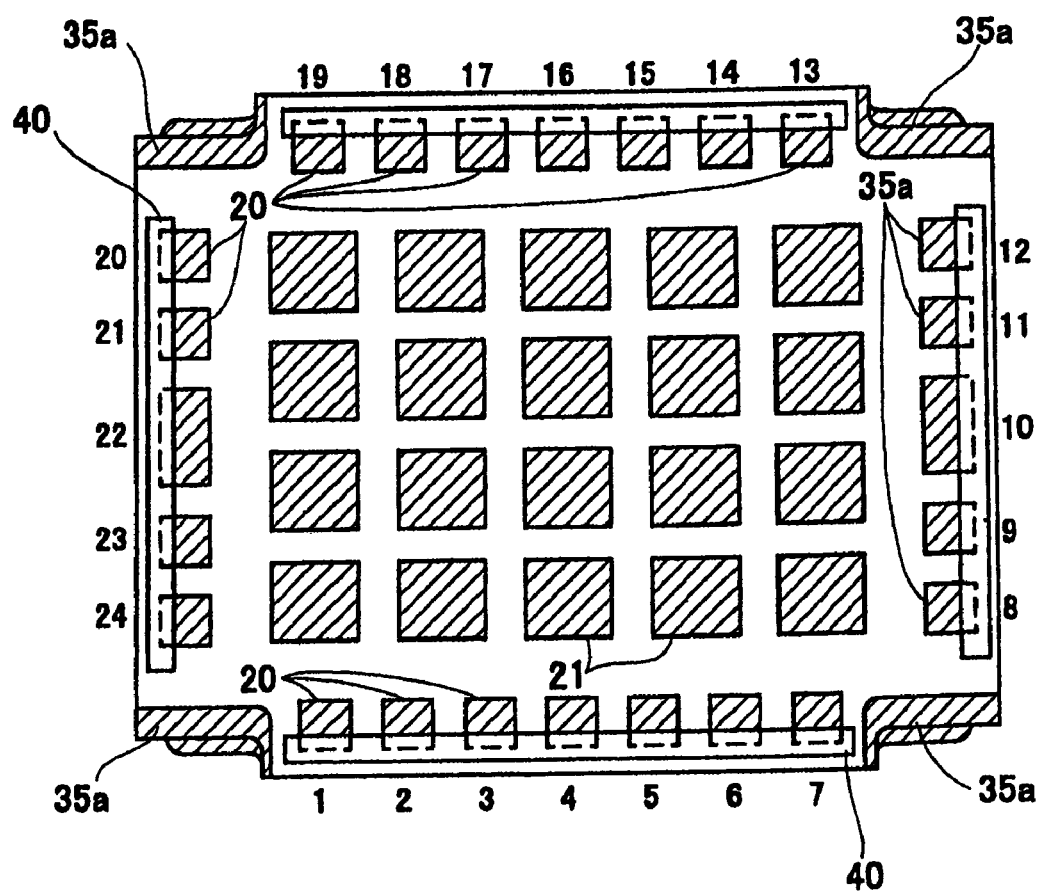
FIG. 3 is a plan view of the bottom of the module substrate of the high-frequency power amplifier module of the embodiment 1.
Figure 4:
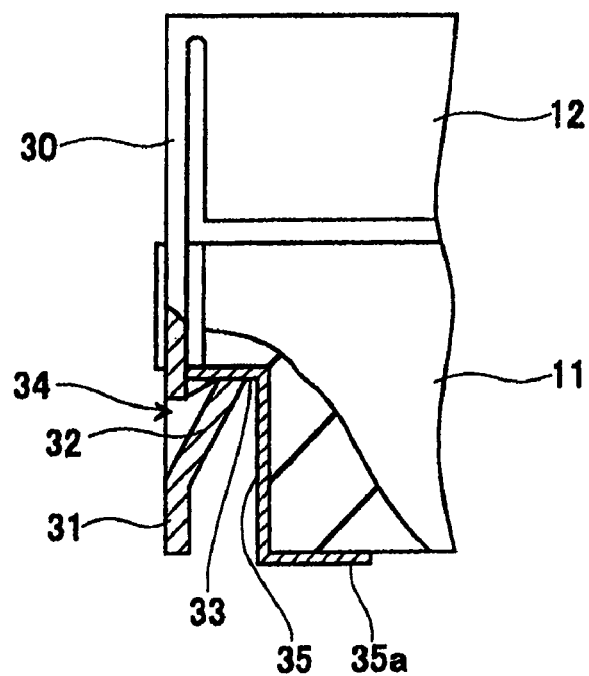
FIG. 4 is a cross-sectional diagram showing part of the high-frequency power amplifier module of the embodiment 1.

The cap 12, which is made of metal, has the electromagnetic shielding effect. The cap 12 is formed by bending a metallic sheet to have a shape of rectangular box with side walls 30 as shown in FIG. 2. Both long side end sections of the cap 12 extend downwardly to form hook support arms 31. The hook support arms 31 have their end section formed to become hooks 32 which protrude inwardly. The hook support arm 31 causes the hook 32 to latch resiliently with a stopper 33 which is a stepped portion of the module substrate 11 as shown in FIG. 4. The module substrate 11 has its four corners cut away inwardly to allow rooms for the hook support arms 31 as shown in FIG. 3. This cut-away portion 34 has a step in the thickness direction, which becomes the stopper 33 to latch with the hook 32 as shown in FIG. 4.

A conductor layer 35 is formed to extend from the stopper 33 to the rear surface of the module substrate 11. The conductor layers 35, in their portion running on the rear surface of module substrate 11 become terminals 35a, which can be used as connection terminals for fixing the high-frequency power amplifier module 10 to the setup board and also as ground terminals. With grounding lands 37 being formed on the main surface of setup board 36 in correspondence to the terminals 35a, the cap 12 used for electromagnetic shielding can be connected to the ground of the setup board by way of the hooks 32 and conductor layers 35. The hook support arm 31 extends to reach or nearly reach the rear surface of the module substrate 11 as shown in FIG. 4, and the high-frequency power amplifier module 10, when it is mounted on the setup board 36, is connected electrically by solder 38 to the grounding lands 37, whereby the high-frequency power amplifier module 10 is enhanced in mount rigidity and ensured in electrical grounding.

The provision of ground terminals at the four corners of the rectangular module substrate 11 facilitates the layout design of external terminals including signal terminals and power terminals of the high-frequency power amplifier module 10, and it also facilitates the layout of wiring lines on the setup board which mounts the module 10.

The module substrate 11 is a ceramic wiring substrate which is formed, for example, by laminating glass ceramics and annealing at a low temperature. The module substrate 11 mounts chip resistors 15, chip capacitors 16, etc. on its main surface as shown in FIG. 1. The module substrate 11 has a recessed area on the main surface, on the bottom of which is mounted a semiconductor chip 17 which constitutes semiconductor amplifying elements. The semiconductor chip 17 has its electrode pins (not shown) connected electrically by wires 18 to wiring lines (not shown) formed on the main surface of the module substrate 11. The semiconductor chip 17 and wires 18 are coated with insulative resin 19 so as to be durable against humidity.

The module substrate 11 has on its rear surface the formation of a plurality of electrode terminals 20 aligned along the edges of substrate and a plurality of power voltage supply terminals 21 arranged in the inner area as shown in FIG. 1 and FIG. 3. The electrode terminals 20 and power voltage supply terminals 21, which are intended for surface mounting of LGA structure, are made from a conductor layer formed on the rear surface of the module substrate 11.

The high-frequency power amplifier module 10 is fixed to the setup board by additional use of the power voltage supply terminals 21 besides the electrode terminals 20, whereby the high-frequency power amplifier module 10 is enhanced in mount rigidity. The power voltage supply terminals 21 also serve as ground terminals, stabilizing the ground voltage in every circuit section of the high-frequency power amplifier module 10, whereby the stable operation of the module can be expected.

The chip resistors 15, chip capacitors 16 and semiconductor chip 17 are fixed by being connected to electrode pads 22 and mount pads 23 which are formed on the main surface of the module substrate 11. The electrode pads 22 and mount pads 23 are made from matalized conductive layers. The portion of module substrate where the semiconductor chip 17 is mounted has the formation of a plurality of through-holes (via holes), which are filled with conductor 24. The conductor 24 connects electrically the mount pads 23 to the power voltage supply terminals 21. The power voltage supply terminals 21 are occasionally used as ground terminals to be connected electrically to the ground pins of semiconductor chip 17. Namely, the power voltage supply terminals 21 can be entirely ground terminals, or can be partially ground terminals and partially connection reinforcing terminals.

Figure 12:
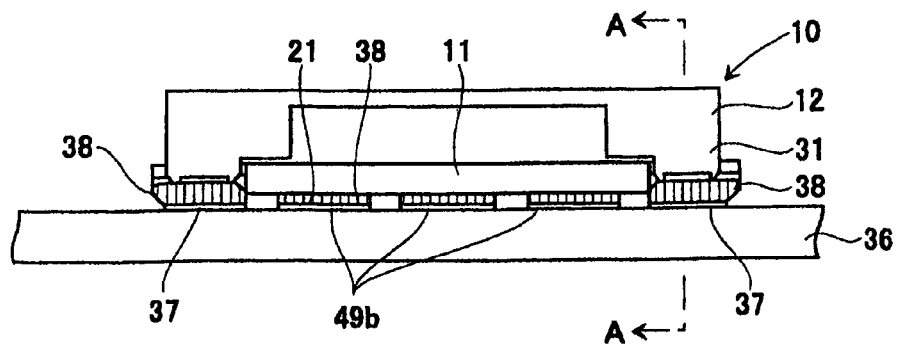
FIG. 12 is a schematic cross-sectional diagram showing the mount state of the high-frequency power amplifier module on the setup board of a portable telephone unit based on the embodiment 1.

The power voltage supply terminals 21 are arranged along the long and short sides of the module substrate 11. In case there is only one power voltage supply terminal 21, the module substrate 11, i.e., the high-frequency power amplifier module 10, when placed on molten solder at the time of mounting, can possibly incline with respect to the setup board. Therefore, in the embodiment 1, solder 38 is fused on the horizontally placed setup board 36, while using the power voltage supply terminals 21 arranged along the long and short sides of the module substrate 11 to support the module substrate 11 (high-frequency power amplifier module 10) horizontally, thereby preventing the high-frequency power amplifier module 10 from being fixed aslant with respect to the setup board, as shown in FIG. 12.

The electrode terminals 20 aligned along the edges of module substrate 11 have the following functions. The electrode terminals 20 are numbered for the purpose of explanation in FIG. 3. Terminals #1, #8, #9, #12, #13, #18, #19, #20 and #24 are non-contact (NC) terminals, #2, #10 and #22 are ground terminals, #3, #4 and #5 are Vdd-GSM terminals, #6 is a Vapc-GSM terminal, #7 is a Pout-DCS terminal, #11 is a Pout-GSM terminal, #14 is a Vapc-DCS terminal, #15, #16 and #17 are Vdd-DCS terminals, #21 is a Pin-GSM terminal, and #23 is a Pin-DCS terminal.

As a feature of this invention, the electrode terminals 20 is coated in their portion close to the module substrate edge with a protection film 40 as shown in FIGS. 1, 3, 5 and 14. In FIG. 3, the power voltage supply terminals 21 and conductor layer 35, which are all conductor, are shown by dashed lines.

The protection film 40 is formed by the following process. Initially, a plurality of green sheets, with wiring patterns being formed thereon, are overlapped, and the sheets are pressed to make a laminated green sheet having an electrode terminal section on the rear surface. Next, paste of glass or solder resist is printed to cover at least the rim section of electrode terminals, thereby forming a protective overlay. Next, the green sheet, electrode terminal section and protective overlay are treated by the annealing process.

The annealing process causes the laminated green sheet to become a module substrate, with the electrode terminal section on the surface and protective overlay of terminal section turning into electrode terminals and protection film. The paste is printed thinner so that the protection film is made as thin as several tens micrometers or less. Consequently, the consumption of paste is reduced and thus the manufacturing cost of module substrate can be reduced, and a thinner module substrate 11 can be accomplished.

The print position can be selected arbitrarily based on the design of screen pattern, which enables accurate printing of a precise pattern. In consequence, the module substrate can be made smaller by the amount of reduced marginal area for electrode terminals at the substrate edges, and thus the module substrate can be made smaller, and thus the high-frequency power amplifier module can be made more compact.

Figure 9:
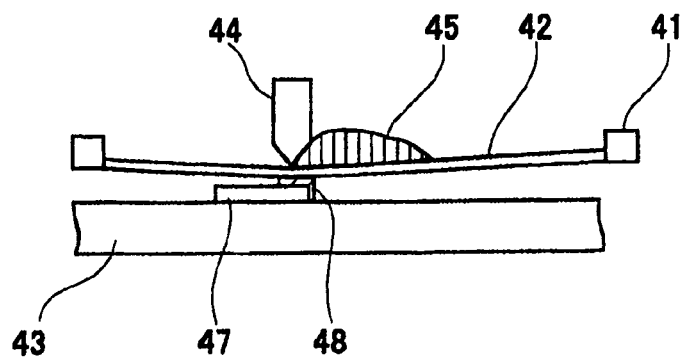
FIG. 9 is a schematic diagram showing the formation of the protection film.
Figure 10:
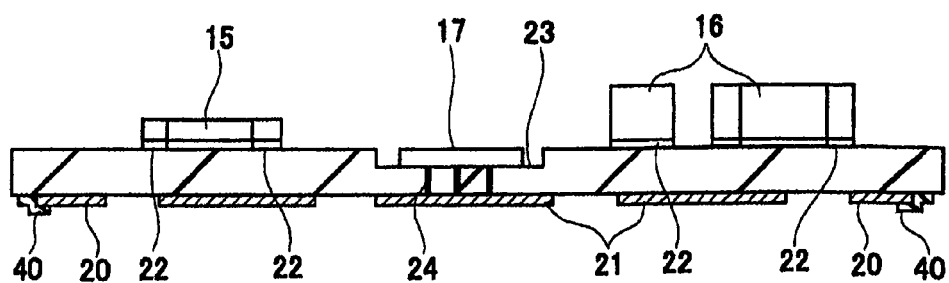
FIG. 10 is a schematic cross-sectional diagram showing the module substrate, with electronic component parts being mounted thereon, in the fabrication process of the high-frequency power amplifier module of the embodiment 1.
Figure 11:
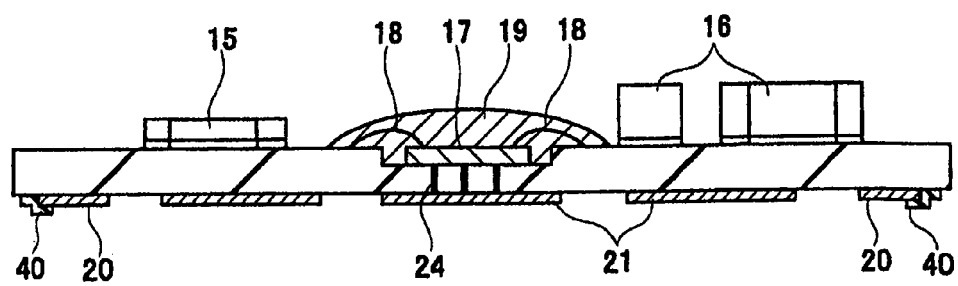
FIG. 11 is a schematic cross-sectional diagram showing the module substrate, with the semiconductor chip and wiring lines being coated with resin, in the fabrication process of the high-frequency power amplifier module of the embodiment 1.

FIG. 9 shows schematically the formation of a protective overlay 48 based on screen printing on a laminated green sheet 43, with an electrode terminal section 47 being formed on its rear surface. The screen 42 stretched across the frame 41 is positioned and brought closely to the rear surface of laminated green sheet 43, and next the skeg 44 is moved so that paste 45 on the screen 42 is printed on a selected position on the rear surface of laminated green sheet 43 to form a protective overlay 48.

Figure 5:
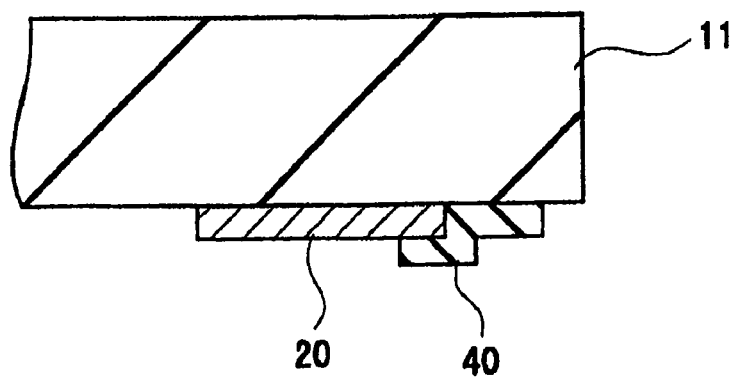
FIG. 5 is a schematic cross-sectional diagram showing part of the module substrate.

Subsequently, the laminated green sheet 43 inclusive of the electrode terminal section 47 and protective overlay 48 is treated by the annealing process. The annealing process causes the electrode terminal section and protective overlay to turn into the electrode terminals 20 and protection film 40, and the laminated green sheet 43 becomes a module substrate 11 as shown in FIG. 5.

Figure 15:
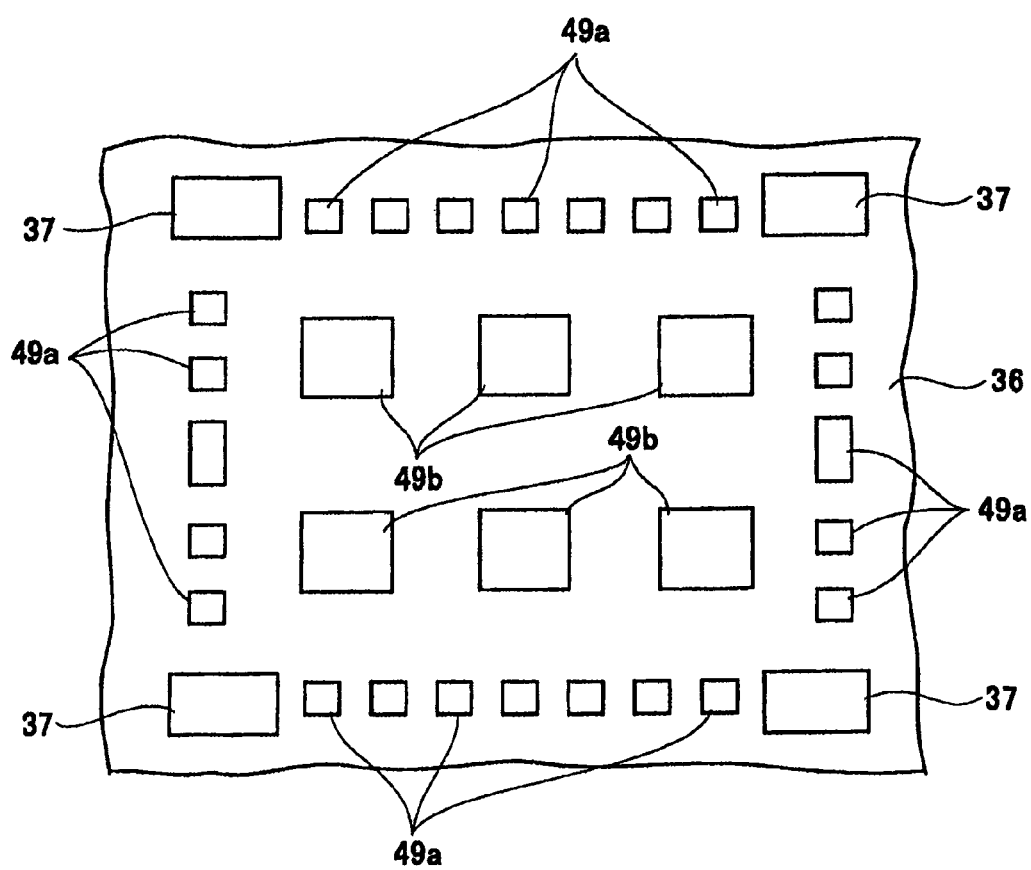
FIG. 15 is a plan view showing part of the layout of lands on the setup board.

FIG. 15 is a plan view of part of the setup board 36 which mounts the high-frequency power amplifier module 10. Lands include grounding lands 37 located at the four corners of substrate corresponding to the terminals 35a, terminal lands 49a, to which the electrode terminals 20 are fixed, aligned between the ground lands 37, and lands 49b to which the power voltage supply terminals 21 are fixed. These lands have application of solder on the surface.

Figure 6:
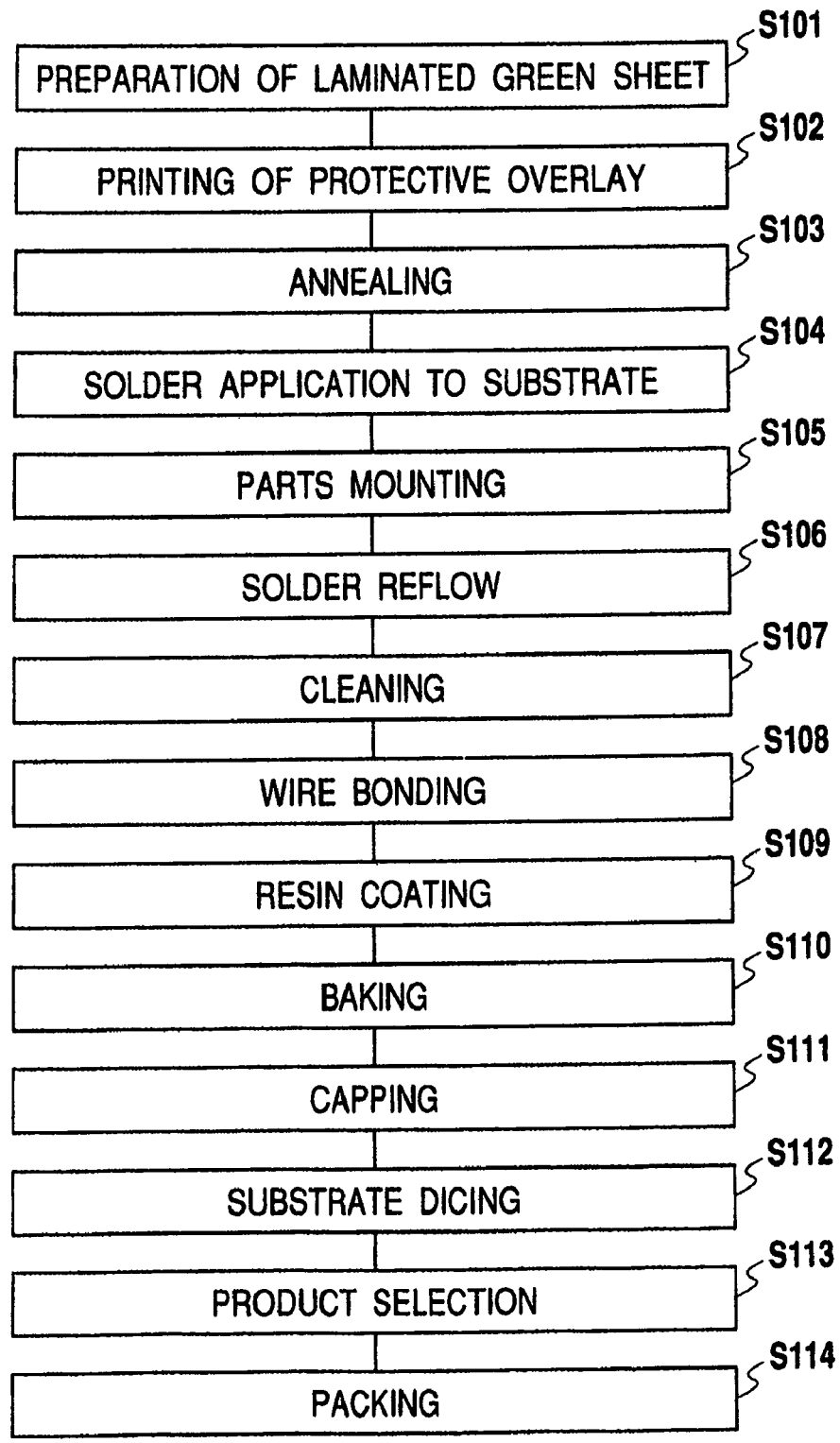
FIG. 6 is a flowchart showing the fabrication process of the high-frequency power amplifier module of the embodiment 1.

Next, the fabrication process of the high-frequency power amplifier module 10 of the embodiment 1 will be explained briefly with reference to the flowchart of FIG. 6. The high-frequency power amplifier module 10 is fabricated and shipped through the processing steps as shown by the flowchart of FIG. 6, which include: preparation of laminated green sheet (step 101), printing of protective overlay (step 102), annealing (step 103), application of solder to module substrate (step 104), mounting of parts (step 105), solder reflow (step 106), cleaning (step 107), wire boding (step 108), coating of resin (step 109), baking (step 110), fixing of cap (CAP) (step 111), dicing of module substrate (step 112), selection (step 113), and packing (step 114). The module substrate may be fabricated for each device, or the module substrate may be divided into devices after caps are put on.

Figure 7:
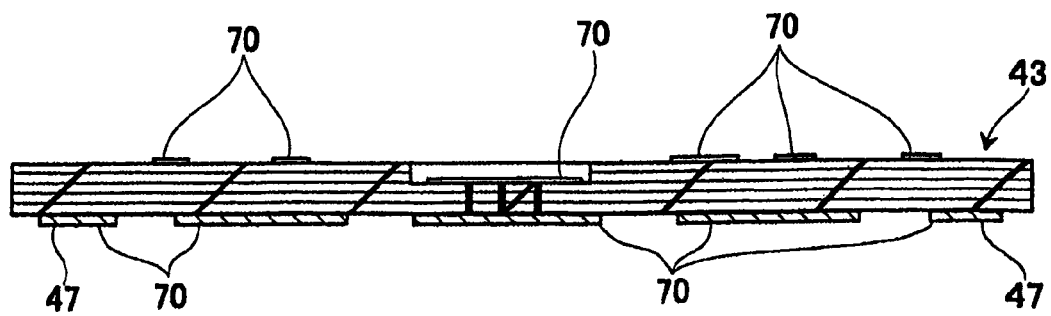
FIG. 7 is a schematic cross-sectional diagram showing the laminated green sheet, with wiring lines and electrode terminals being formed thereon, in the fabrication process of the high-frequency power amplifier module of the embodiment 1.

The laminated green sheet 43 is made by, for example, overlapping a plurality of dielectric sheets (green sheets) and pressing the sheets as shown in FIG. 7. The figure shows the structure including five green sheets laminated. The diagram corresponds to FIG. 1.

The laminated green sheet 43 has the formation on the rear surface thereof of a conductor layer 70 which becomes the electrode terminals 20 and power voltage supply terminals 21, and has the formation on the main surface thereof of another conductor layer 70 which becomes the electrode pads 22 and mount pads 23 for mounting electronic component parts. The portion of conductor layer 70 for the electrode terminals 20 is called the electrode terminal section 47 as mentioned previously. In the area where the semiconductor chip is mounted, the upper first and second green sheets are cut away to make a recessed area on the laminated green sheet 43. This recessed area also has on its bottom the formation of a conductor layer 70: (step 101).

Figure 8:
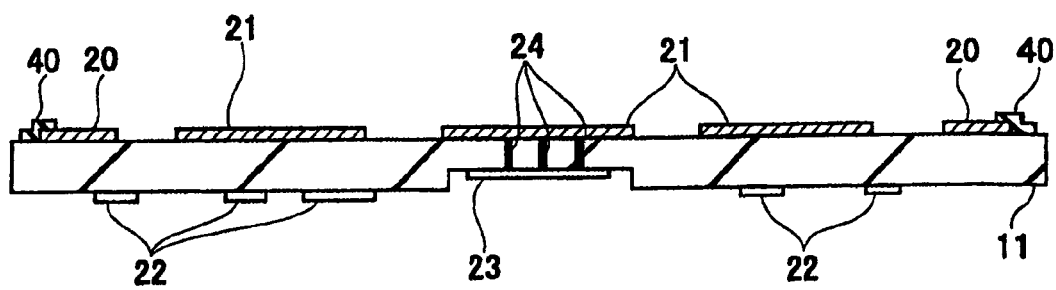
FIG. 8 is a schematic cross-sectional diagram showing the module substrate, with the electrode terminals being coated in their outer edge section with a protection film, in the fabrication process of the high-frequency power amplifier module of the embodiment 1.

Next, with the laminated green sheet 43 being turned over, the above-mentioned paste is printed on the rim of electrode terminals 20 which are close to the edges of laminated green sheet 43, thereby forming the protective overlay 48: (step 102), and the sheet 43 is treated by annealing: (step 103), and the module substrate 11 having the electrode terminals 20 and power voltage supply terminals 21 is made as shown in FIG. 8. The electrode terminals 20 are coated in their rim portion close to the edge of module substrate 11 with the protection film 40. The electrode pads 22, mount pads 23 and conductors 24 are also formed. Wiring lines of this module substrate 11 have the strip line structure or micro strip line structure.

Next, solder is applied to the surface of all conductor layers: (step 104), electronic component parts including the semiconductor chip 17, chip resistors 15 and chip capacitors 16 are mounted: (step 105), and the solder is heated to reflow so that the electronic parts are connected: (step 106).

The module substrate 11 is around 0.8 mm in thickness, 15 mm in width and 8 mm in length, for example. The thickness of the electrode of the electrode terminal is about 10 m. The protection film which partially covers the electrode terminals is around several tens micrometers or less in thickness.

Next, the module substrate is cleaned to wash off flux: (step 107), the semiconductor chip 17 is connected from its terminals (not shown) to wiring lines by conductive wires 18: (step 108), and the semiconductor chip 17 and wires 18 are coated with insulative resin 19: (step 109).

Next, the module substrate is baked to harden the insulative resin 19: (step 110).

Next, caps 12 are put on the module substrate 11: (step 111), and the substrate is divided into high-frequency power amplifier modules 10 as shown in FIG. 2: (step 112). Next, the modules 10 are selected in terms of quality: (step 113), and good modules are packed for shipment: (step 113).

The following explains an electronic device, i.e., portable telephone unit (wireless communication unit), which incorporates the inventive high-frequency power amplifier module 10. The high-frequency power amplifier module 10 is mounted on the setup board 36 of the portable telephone unit (wireless communication unit). FIG. 12 shows the high-frequency power amplifier module 10 mounted on the setup board 36. The high-frequency power amplifier module 10 is placed by being positioned on the setup board 36 having a land pattern as shown in FIG. 15. Solder which has been applied to the surface of lands (37, 49a and 49b) and terminals (20, 21 and 35a) is heated to reflow so that the module is connected to them, and the portable telephone unit as shown in FIG. 12 (only the module setup portion is shown) is completed.

Figure 13:
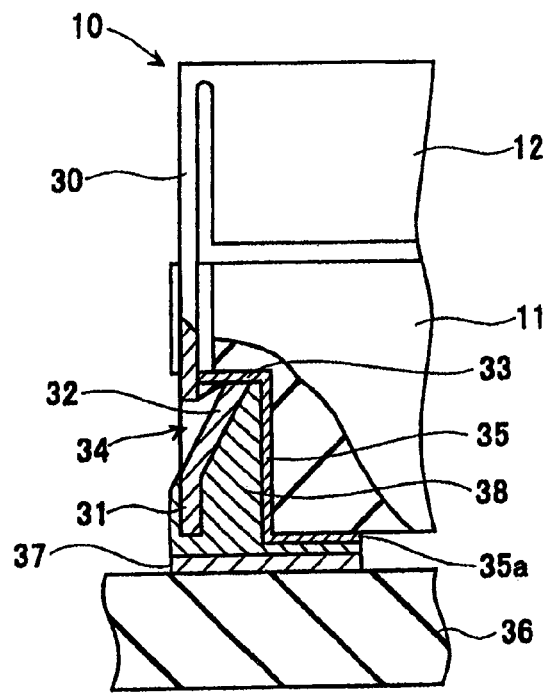
FIG. 13 is a cross-sectional diagram showing part of the mount state of the high-frequency power amplifier module.

FIG. 13 is a cross-sectional diagram showing the fitting of the hook 32. The conductor layer 35, the hook 32 and the lower end of the hook support arm 31 are fixed to the grounding land 37 by solder 38. The hook support arm 31 has its solder fillet on its outer surface jutting out as little as around 0.3 m for example. Based on the package structure built by the module substrate 11 and cap 12, with the hooks 3 of cap latching with the hook stoppers 33 of module substrate 11 in the cut-away portions 34 provided at both ends of long side of the module substrate 11, and on the jut-out length of solder fillet as small as 0.3 m, it is possible to lay out the grounding lands 37 in rectangular areas created on the extended lines of the substrate sides. In consequence, the size reduction of the setup board 36 of the portable telephone unit and thus the size reduction of the portable telephone unit can be attained.

Figure 14:
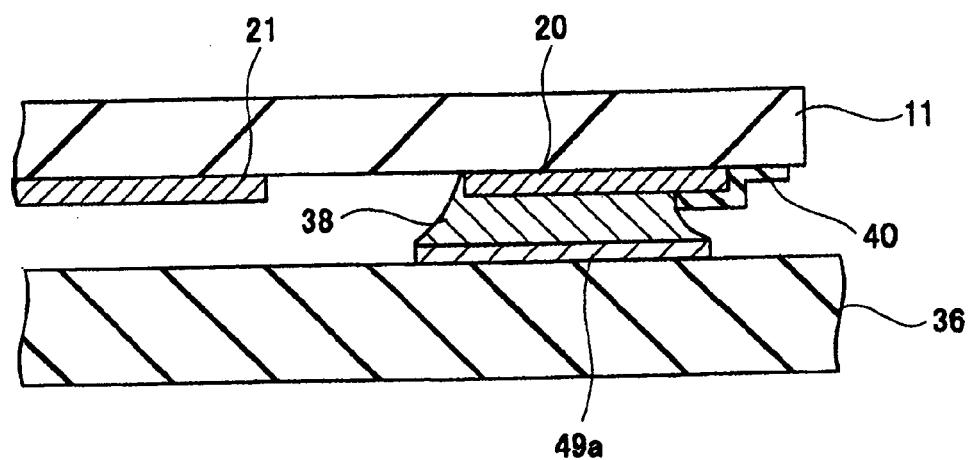
FIG. 14 is a cross-sectional diagram showing part of the mount state of the electrode terminal section of the high-frequency power amplifier module.
Figure 24:
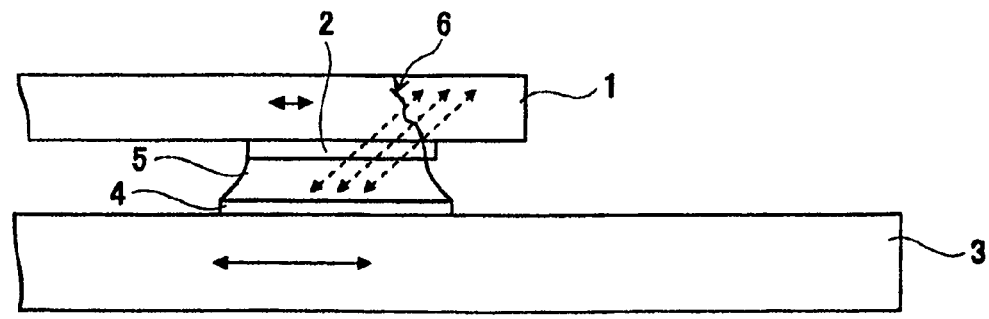
FIG. 24 is a schematic diagram explaining the faulty mounting of a high-frequency power amplifier module revealed by the study conducted by the inventors prior to the present invention.

The electrode terminals 20 of LGA structure aligned along the edges of module substrate 11 are coated in their portion close to the substrate edge with the protection film 40 as shown in FIG. 14, and consequently even if there arises a thermal stress between the electrode terminals 20 and the module substrate 11, the module substrate 11 is prevented from developing cracks 6 shown in FIG. 24 in its terminal border portion close to the substrate edge.

In consequence, the interior of package 13 is free from penetration of water or the like through cracks, whereby the high-frequency power amplifier module 10 is enhanced in reliability and life span.

Figure 16:
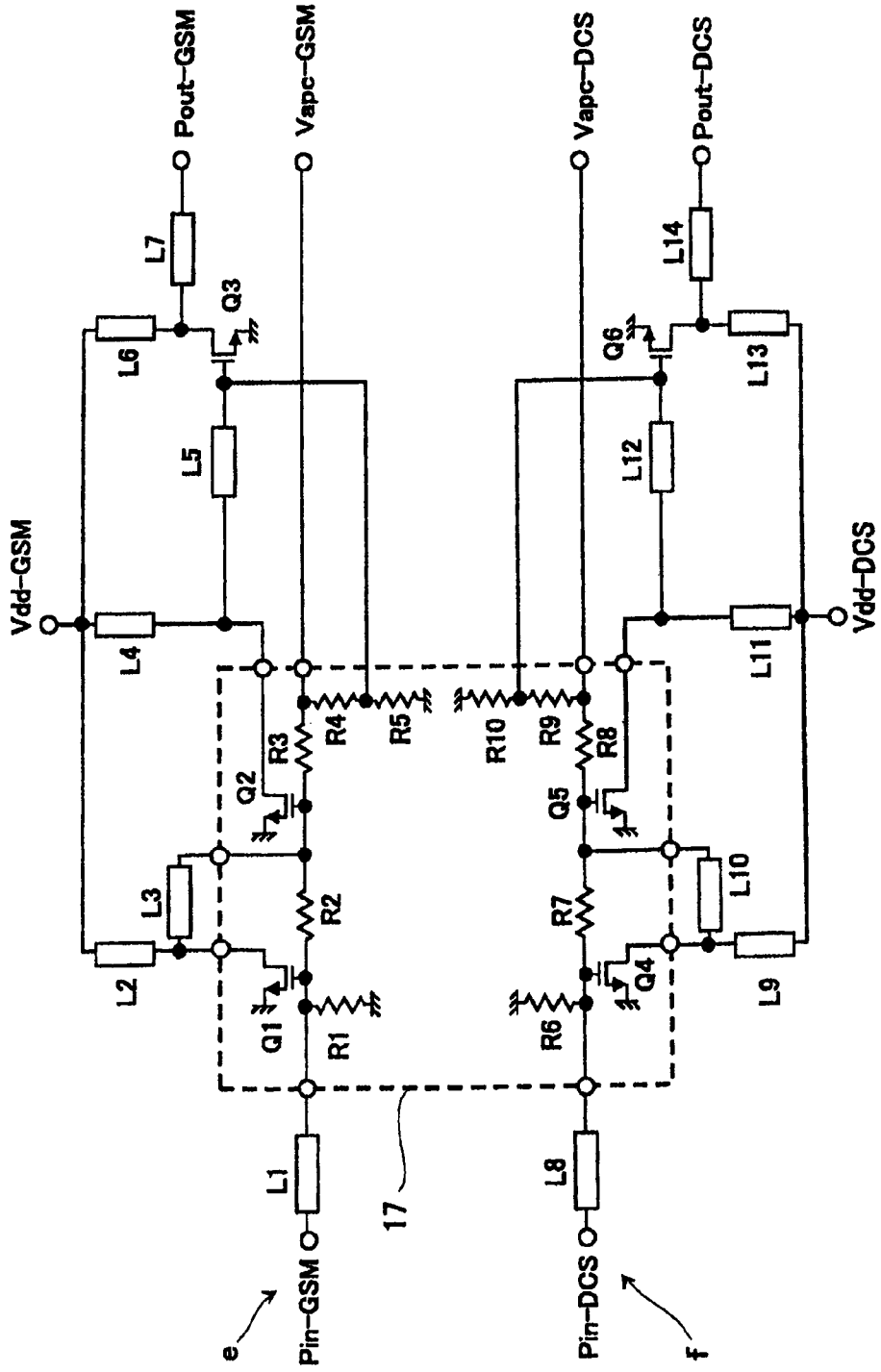
FIG. 16 is an equivalent circuit diagram of the high-frequency power amplifier module.

The high-frequency power amplifier module 10 of the embodiment 1 has a circuit arrangement as shown in FIG. 16, which includes line patterns and electronic component parts including semiconductor amplifying elements formed and mounted on the module substrate 11.

The high-frequency power amplifier module has an amplifying system "e" for GSM and another amplifying system "f" for DCS. These amplifying systems "e" and "f" have the same circuit arrangement and are different in some of their component parts. The following is the explanation of amplifying system "e", which is common to the amplifying system "f", with its component parts being written in parenthesis.

Among the external electrode terminals of the module, the amplifying system "e" has an input terminal Pin-GSM (Pin-DCS), an output terminal Pout-GSM (Pout-DCS), a first reference voltage, i.e., power voltage, terminal Vdd-GSM (Vdd-DCS), a bias voltage terminal Vapc-GSM (Vapc-DCS), and a second reference voltage, i.e., ground voltage, terminal GND (common).

Three amplifying stages are connected tandem between the terminals Pin-GSM (Pin-DCS) and Pout-GSM (Pout-DCS). The first, second and third (last) amplifying stages are transistors Q1, Q2 and Q3 (Q4, Q5 and Q6), respectively.

The transistor of each stage has a control terminal (gate electrode) which receives the input signal or bias voltage to the stage, a first terminal (drain electrode) which releases the output signal of the stage, and a second terminal (source electrode) which receives the reference voltage (ground voltage) for the stage.

The Pin-GSM (Pin-DCS) is connected to the gate electrode of the transistor Q1 (Q4) through a matching circuit L1 (L8). The second and third transistors have their gate electrodes connected to the drain electrodes of the respective former-stage transistors through matching circuits L3 (L10) and L5 (L12), respectively. The last-stage, i.e., output, transistor Q3 (Q6) has its drain electrode connected to the Pout-GSM (Pout-DCS) through a matching circuit L3 (L6).

All transistors Q1, Q2 and Q3 (Q4, Q5 and Q6) have their drain electrodes connected to the Vdd-GSM (Vdd-DCS) through matching circuits L2, L4 and L6 (L9, L11 and L13).

All transistors Q1, Q2 and Q3 (Q4, Q5 and Q6) have their gate electrodes connected to the Vapc-GSM (Vapc-DCS). Arranged on the path between these gate electrodes and the Vapc-GSM (Vapc-DCS) are bias circuits which control the bias voltages of the gate electrodes. The bias circuits are made up of voltage dividing resistors R1-R5 (R6-R10).

The portion of FIG. 16 enclosed by the dashed line is the semiconductor chip (FET chip) 17. The semiconductor chip 17 incorporates the transistors Q1 and Q2 of the GSM amplifying system "e" and the bias voltage setting resistors R1, R2, R3, R4 and R5 for the transistors Q1 and Q2, and the transistors Q4 and Q5 of the DCS amplifying system "f" and the bias voltage setting resistors R6, R7, R8, R9 and R10 for the transistors Q4 and Q5. Based on the monolithic structure of these elements, the high-frequency power amplifier module can be made compact and the manufacturing cost can be reduced.

Figure 17:
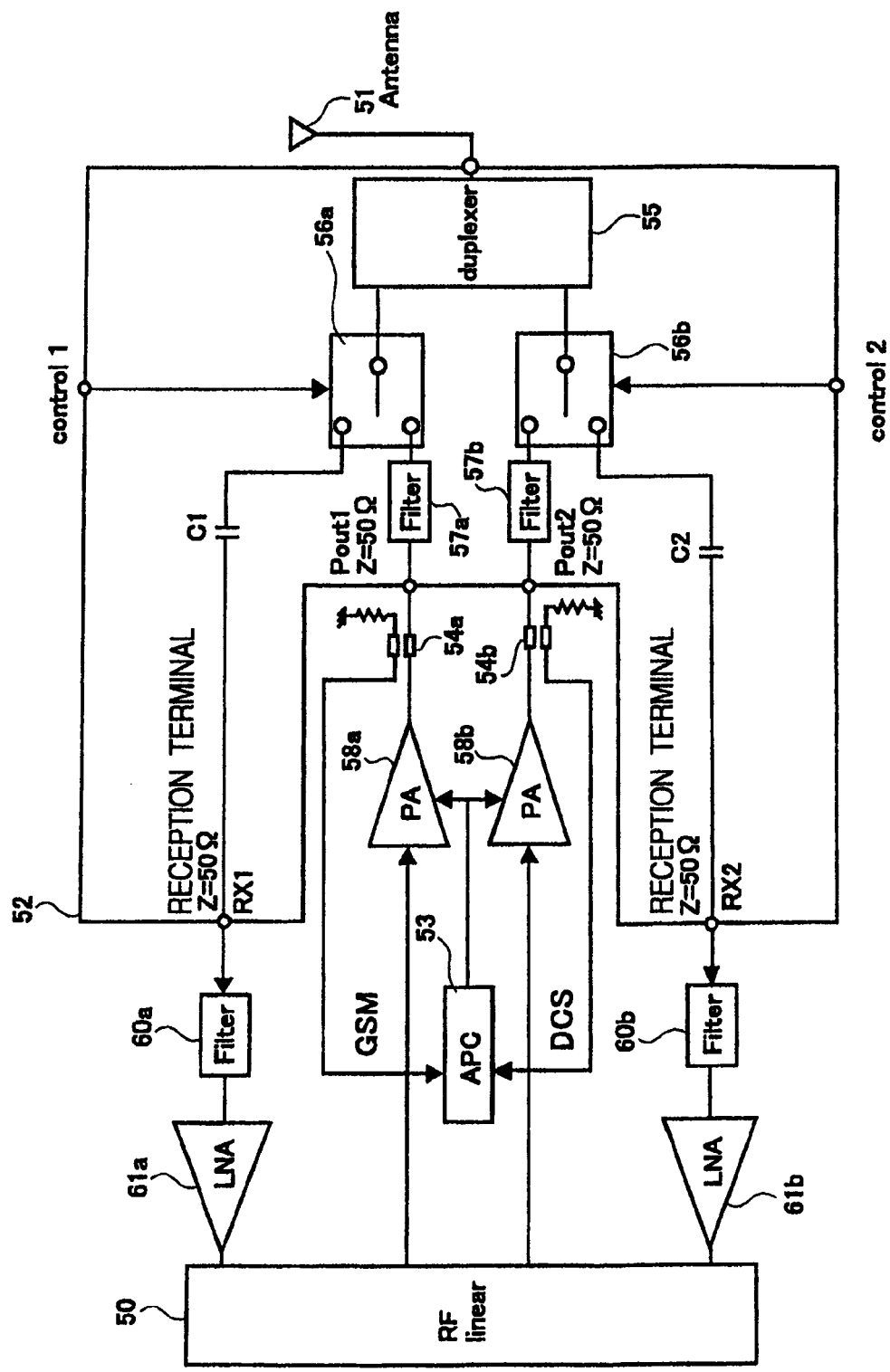
FIG. 17 is a block diagram showing the functional arrangement of the portable telephone unit.

This high-frequency power amplifier module is built in a portable telephone unit as shown in FIG. 17. The figure is a block diagram of part of a dual-band wireless communication unit, showing a portion from a high-frequency signal processor IC (RF linear) 50 up to an antenna 51. The circuit arrangement is divided into the GSM amplifying system and DCS amplifying system which include a power amplifier (PA) 58a and power amplifier (PA) 58b, respectively.

The antenna 51 is connected to the antenna terminal of the antenna transmission/reception switching device 52. The antenna transmission/reception switching device 52 has terminals Pout1 and Pout2 for receiving the outputs of the PA58a and PA58b, reception terminals RX1 and RX2, and control terminals control1 and control2.

The signal for GSM from the high-frequency signal processor IC 50 is put in to the PA58a and released to the Pout1. The output of PA58a is detected by a coupler 54a, and the detected signal is fed back to an automatic output control circuit (APC circuit) 53. The APC circuit 53 operates based on the detected signal to control the PA58a.

Similarly, the signal for DCS from the high-frequency signal processor IC 50 is put in to the PA58b and released to the Pout2. The output of PA58b is detected by a coupler 54b, and the detected signal is fed back to the APC circuit 53. The APC circuit 53 operates based on the detected signal to control the PA58b.

The antenna transmission/reception switching device 52 has a duplexer 55. The duplexer 55 has its one terminal connected to the antenna terminal, and has another two terminals connected to a GSM transmission/reception switch 56a and to a DCS transmission/reception switch 56b.

The transmission/reception switch 56a has its a-contact connected to the Pout1 through a filter 57a, and has its b-contact connected to the reception terminal RX1 through a capacitor C1. The transmission/reception switch 56a is operated to select the a-contact or b-contact by a control signal received on the control terminal 1.

The transmission/reception switch 56b has its a-contact connected to the Pout2 through a filter 57b, and has its b-contact connected to the reception terminal RX2 through a capacitor C2. The transmission/reception switch 56b is operated to select the a-contact or b-contact by a control signal received on the control terminal 2.

A filter 60a and low-noise amplifier (LNA) 61a are connected in this order between the reception terminal RX1 and the high-frequency signal processor IC 50. A filter 60b and low-noise amplifier (LNA) 61b are connected in this order between the reception terminal RX2 and the high-frequency signal processor IC 50.

This wireless communication unit performs both the GSM communication and DCS communication.

The embodiment 1 has the following effectiveness.

(1) In the high-frequency power amplifier module (hybrid integrated circuit device), the electrode terminals 20 of LGA structure aligned along the edges of module substrate 11 are coated in their portions close to the substrate edge with the protection film 40, and accordingly even if there arises a thermal stress between the electrode terminals 20 and the module substrate 11 when the module is mounted on the setup board 36 of portable telephone unit, the module substrate 11 is prevented from cracking in its terminal border portion close to the substrate edge and thus the interior of package 13 is free from penetration of water or the like through cracks, whereby the high-frequency power amplifier module 10 and portable telephone unit are enhanced in reliability and life span.

(2) The protection film 40 which is made from printed paste can be as thin as several tens micrometers or less, enabling the reduction of thickness of the module substrate and also the reduction of manufacturing cost owing to the reduced consumption of paste. In consequence, the reduction of manufacturing cost of the portable telephone unit can be attained.

(3) The protection film 40 is formed by printing paste instead of using a green sheet having through-holes, which enables the size reduction of the module substrate 11 and thus the size reduction of the high-frequency power amplifier module 10. In consequence, the size reduction of the portable telephone unit can be attained.

(4) The high-frequency power amplifier module 10 is fixed to the setup board 36 by additional use of the power voltage supply terminals 21 besides the electrode terminals 20, whereby the high-frequency power amplifier module 10 is enhanced in mount rigidity. The power voltage supply terminals 21 also serve as ground terminals, stabilizing the ground voltage in every circuit section of the high-frequency power amplifier module 10, whereby the stable operation can be expected. In consequence, the portable telephone unit operates stably, enabling the user to have comfortable communication.

(5) The power voltage supply terminals 21 are arranged along the long side and short side of the module substrate 11. On this account, the high-frequency power amplifier module 10 is mounted by being placed uprightly on multiple reflowing molten solder spots so that the module substrate 11 is mounted by being spaced out evenly from the setup board 36, whereby power supply probabilities such as efficiency can be stabilized. In consequence, the portable telephone unit operates stably, enabling the user to have comfortable communication.

(6) The module substrate 11 has the formation cut-away portions 34 at both ends of long side, in which portions the cap 12 has its hooks 32 latching with the hook stoppers 33 of the module substrate 11, thereby building a package, and the hook support arms 31 have their solder fillet jutting out as little as 0.3 m. Accordingly, the mount area can be virtually within the area defined by the profile of cap 12, enabling the reduction of mount area. In consequence, the size reduction of the portable telephone unit can be attained.

(7) The hook support arms 31 extend downward to reach or nearly reach the rear surface of the module substrate 11, and accordingly the high-frequency power amplifier module 10, when mounted on the setup board 36 by soldering, is connected electrically by soldering to the grounding lands 37, whereby the high-frequency power amplifier module 10 is enhanced in mount rigidity and ensured in electrical grounding. In consequence, the portable telephone unit operates stably, enabling the user to have comfortable communication.

(8) The provision of ground terminals at the four corners of the rectangular module substrate 11 facilitates the layout design of external terminals including the signal terminals and power terminals of the high-frequency power amplifier module 10, and it also facilitates the layout of wiring lines on the setup board which mounts the module 10.

Embodiment 2

Figure 18:
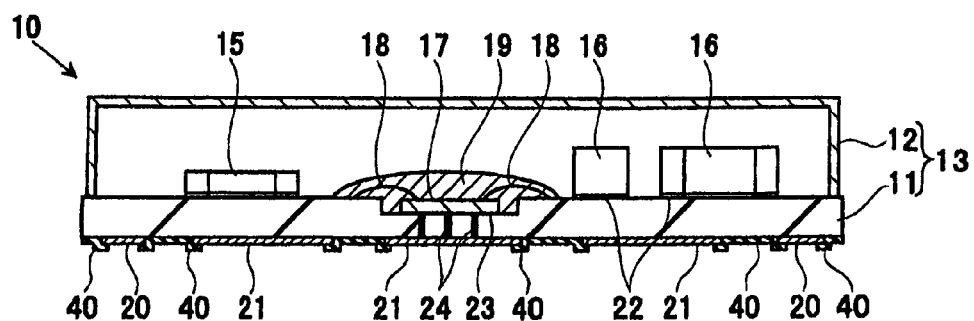
FIG. 18 is a schematic cross-sectional diagram of a high-frequency power amplifier module based on another embodiment (embodiment 2) of this invention.
Figure 19:
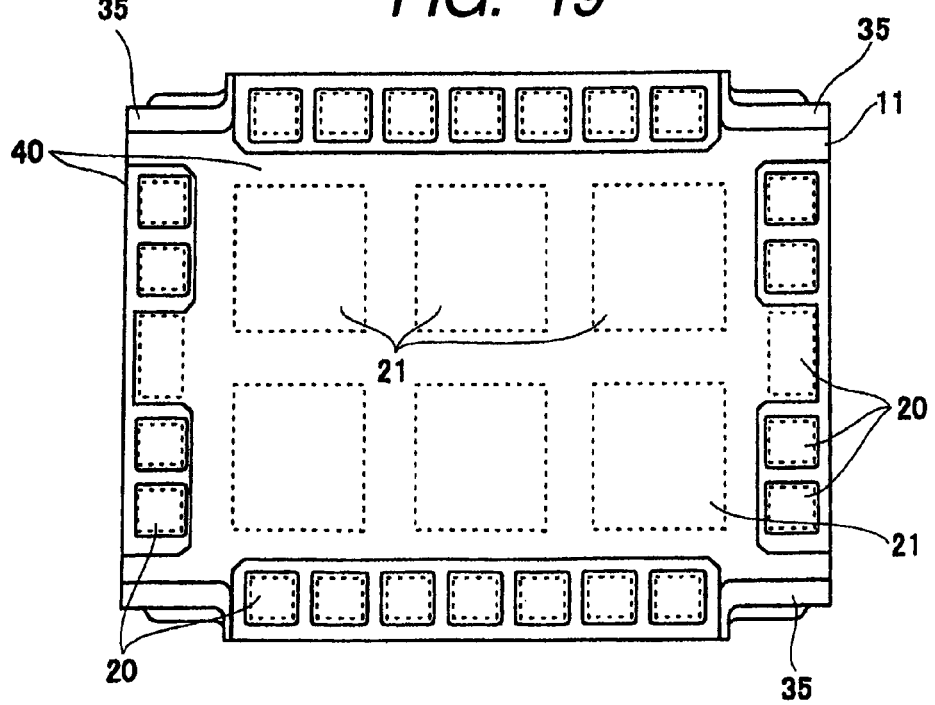
FIG. 19 is a plan view of the bottom of the module substrate of the high-frequency power amplifier module of the embodiment 2.
Figure 20:
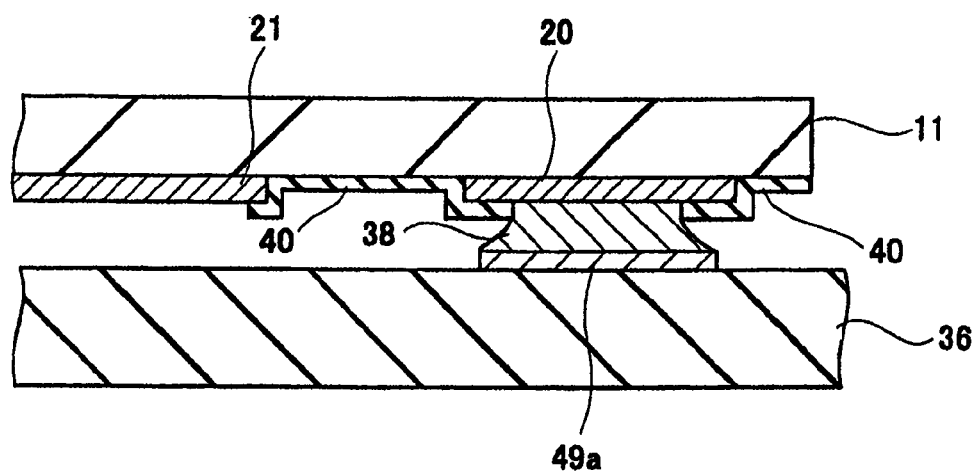
FIG. 20 is a cross-sectional diagram showing partially the connection of an electrode terminal to the substrate of the high-frequency power amplifier module of the embodiment 2.

FIG. 18 is a schematic cross-sectional diagram of a high-frequency power amplifier module based on another embodiment (embodiment 2) of this invention. FIG. 19 is a plan view of the bottom of the module substrate of the high-frequency power amplifier module. FIG. 20 is a cross-sectional diagram showing partially the connection of an electrode terminal to the setup board of the high-frequency power amplifier module.

In this example of the embodiment 2, a protection film 40 is coated around the whole rim of the electrode terminals 20 and power voltage supply terminals 21 as shown in FIG. 18, FIG. 19 and FIG. 20. The embodiment 2 has the same effectiveness as the embodiment 1.

Embodiment 3

Figure 21:
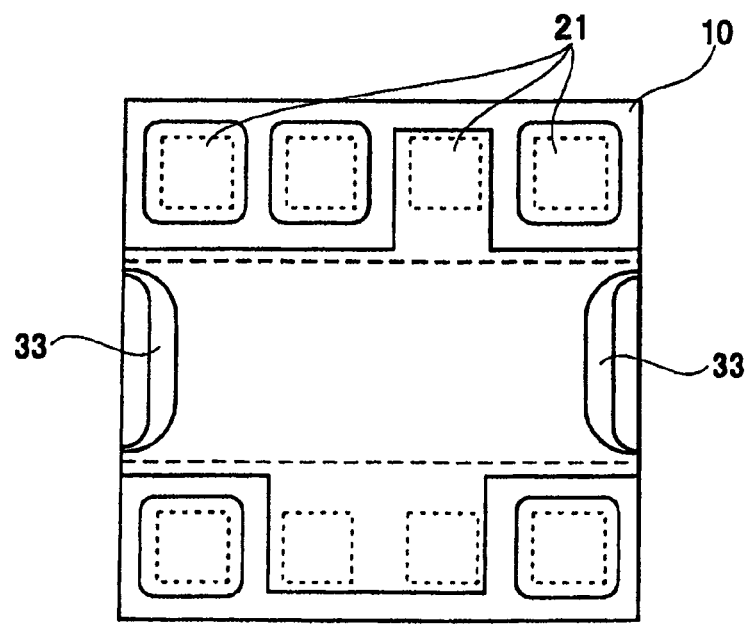
FIG. 21 is a plan view of the bottom of a high-frequency power amplifier module based on still another embodiment (embodiment 3) of this invention.

FIG. 21 is a plan view of the bottom of a high-frequency power amplifier module based on still another embodiment (embodiment 3) of this invention. In this example of the embodiment 3, hook stoppers 33 are disposed at the middle of the sides of the module substrate 11. In correspondence to these hook stoppers 33, the cap 12 has its hook support arms 31 (not shown) located at the middle of the sides of the cap 12. In the embodiment 3, the foot print on the terminal side can be connected without jutting out of the module substrate, allowing the user's circuit board to have an increased setup area.

Embodiment 4

Figure 22:
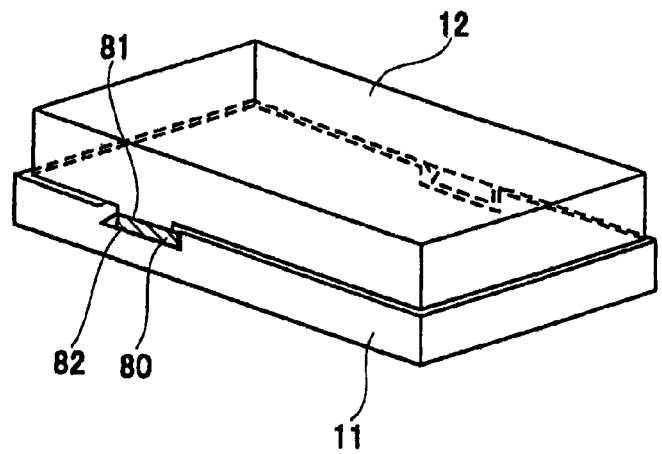
FIG. 22 is a perspective view of a high-frequency power amplifier module based on still another embodiment (embodiment 4) of this invention.
Figure 23:
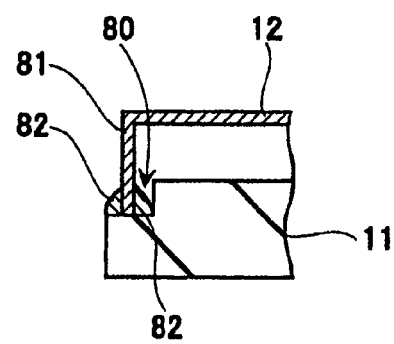
FIG. 23 is a cross-sectional diagram showing part of the high-frequency power amplifier module of the embodiment 4.

FIG. 22 is a perspective view of a high-frequency power amplifier module based on still another embodiment (embodiment 4) of this invention, and FIG. 23 is a cross-sectional diagram of the hook/stopper section of the module substrate 11 and cap 12. In the embodiment 4, the module substrate 11 has, on its two confronting sides, cut-away portions 80, and the cap 12 has lugs 81 to latch with the substrate cut-away portions. The cap 12 is put on the module substrate 11, and the lugs 81 and cut-away portions are coupled and fixed by solder 82.

According to the embodiment 4, when the caps are soldered to the substrate before it is diced, unsuccessful division due to erroneous soldering which bridges between adjacent caps can virtually be avoided.

Although the present invention has been described in connection with the specific embodiments, the invention is not confined to these embodiments, but various alterations are obviously possible without departing from the essence of the invention. For example, the foregoing embodiments are high-frequency power amplifier modules as hybrid integrated circuit device, the present invention is applicable to other hybrid integrated circuit devices and electronic devices which incorporate these devices. For example, the present invention can also be applied to the voltage-controlled oscillator (VCO) and antenna switch among the circuit devices used in portable telephone units.

Although the semiconductor amplifying elements used for the amplifying stages of the embodiment 1 are MOS (Metal Oxide Semiconductor) FETs, these elements may be replaced with transistors of other types such as silicon bipolar transistors, GaAs-MES (Metal-Semiconductor) FETs, HBT (Hetero Junction Bipolar Transistors), HEMT (High Electron Mobility Transistors), and Si—Ge FETs.

INDUSTRIAL APPLICABILITY

As described above, the inventive hybrid integrated circuit device is used by being incorporated as a high-frequency power amplifier module which is used in the transmitter of wireless communication units such as cellular telephone units. Particularly, the inventive high-frequency power amplifier module has its module substrate reinforced in the portion close to the substrate edge by the coating of a protection film, whereby the occurrence of substrate cracking at the time of module mounting can be alleviated and the reliability of module mounting can be enhanced.

The invention claimed is:

1. An electronic device comprising:
    a wiring substrate having an obverse surface, a reverse surface opposite to the obverse surface, a plurality of first land pads formed over the obverse surface, and a plurality of second land pads formed over the reverse surface, and a third land pad formed over the reverse surface, and parts of the plurality of first land pads are electrically connected to parts of the plurality of second land pads;
    a semiconductor chip mounted over the obverse surface of the wiring substrate having a top surface, a bottom surface opposite to the top surface, and a plurality of pads formed over the top surface, the plurality of pads are electrically connected to the plurality of first land pads of the wiring substrate via a plurality of wires, respectively, and the bottom surface is electrically connected to the third land pad of the wiring substrate;
    a plurality of passive components mounted on the obverse surface of the wiring substrate and connected to the wiring substrate electrically; and
    a sealing body sealing the semiconductor chip and the plurality of wires;
    wherein the plurality of the second land pads are disposed over the bottom surface of the wiring substrate such that the second land pads of the plurality of the second land pads surround the third land pad,
    wherein the third land pad is divided into a plurality of regions, and
    wherein an area of one of the plurality of regions of the third land pad is larger than an area of one of the plurality of second land pads.

2. The electronic device according to claim 1, wherein the plurality of second land pads are disposed along sides of the wiring substrate.

3. The electronic device according to claim 1, wherein the bottom surface of the semiconductor chip is connected to the third land pad via metal via holes.

* * * * *